United States Patent [19]

Thomas

[11] 4,041,327
[45] Aug. 9, 1977

[54] SENSE POINT CIRCUIT

[75] Inventor: Robert M. Thomas, Maitland, Canada

[73] Assignee: GTE Automatic Electric (Canada) Ltd., Brockville, Canada

[21] Appl. No.: 711,018

[22] Filed: Aug. 2, 1976

[51] Int. Cl.² ............................................. H03K 5/08
[52] U.S. Cl. ................................ 307/231; 307/362;
307/243; 307/253; 307/314; 340/173 R;
307/238
[58] Field of Search .................. 307/243, 235 B, 242,
307/270, 282, 300, 235 T, 231, 253, 241, 314,
238; 40/173 R

[56] References Cited
U.S. PATENT DOCUMENTS

| | | | |
|---|---|---|---|
| 3,604,950 | 9/1971 | Anderson et al. | 307/243 |
| 3,641,365 | 2/1972 | Grant et al. | 307/241 |
| 3,714,469 | 1/1973 | Uchida | 307/253 |
| 3,742,830 | 7/1973 | Matsuzaki et al. | 307/238 |

FOREIGN PATENT DOCUMENTS 1,007,450  10/1965  United Kingdom ............ 307/235 B Primary Examiner—John S. Heyman

[57] ABSTRACT

The disclosure relates to a sense point circuit for sensing the active or inactive condition of an electrical path as represented by the conduction or nonconduction of a solid state device in response to an interrogating signal pulse. The sense point circuit comprises an input for receiving the interrogating signal pulses, a solid state switch such as a transistor, and a transformer having a primary coupled across the base and emitter of the transistor and a secondary coupled across the solid state device and an output coupled to the emitter of the transistor. The sense point circuit additionally includes a first resistor coupled between the input and the common junction of the base of the transistor and the transformer primary, and a second resistor coupled between the input of the sense point circuit and the collector of the transistor. When the solid state device is conductive, the primary winding of the transformer provides a substantially short circuit across the base and the emitter of the transistor, to thereby cause the transistor to be nonconductive upon the receipt of an interrogating pulse so that the interrogating pulse is conducted from the input to the output through the first resistor and the transformer primary. When the solid state device is nonconductive, the primary provides a substantially open circuit between the transistor base and emitter to thereby cause the transistor to conduct upon receipt of an interrogating pulse so that the interrogating pulse is conducted from the input to the output through the second resistor and the transistor for providing a second signal. Because the first resistor has a resistance greater in magnitude than the second resistor, the first signal magnitude is substantially less than the second signal magnitude.

7 Claims, 1 Drawing Figure

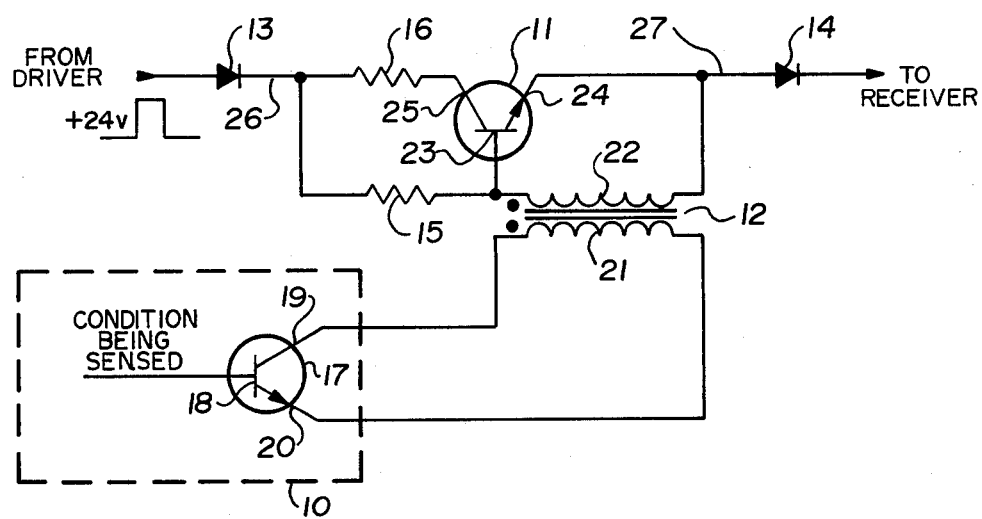

SENSE POINT CIRCUIT

BACKGROUND OF THE INVENTION

The present invention is generally directed to a sense point circuit and more particularly to a sense point circuit for sensing the active or inactive condition of an electrical path as represented by the conduction or nonconduction of a solid state device.

Sense point circuits are well known. They find general application in telephone systems wherein the active or inactive conditions of electrical paths including relays or the like must be sensed in order to provide efficient and reliable telephone service. When the active or inactive conditions of relays are to be sensed, prior sense point circuits have been generally successful because mechanical relays provide inherent isolation between the sense point circuits and the relay contacts. However, with solid state switches and the like becoming increasingly popular, such sense point circuits are not so successful. The prior sense point circuits are generally unsuccessful because solid state switches or the like do not afford readily available isolation between the sense point circuits and the condition to be sensed.

It is therefore a general object of the present invention to provide a new and improved sense point circuit.

It is a more particular object of the present invention to provide a sense point circuit which senses the active or inactive condition of an electrical path which includes solid state devices while still providing sufficient isolation between the sense point circuit and the condition being sensed.

SUMMARY OF THE INVENTION

The invention provides a sense point circuit for sensing the active or inactive condition of an electrical path as represented by the conduction or nonconduction of a solid state device in response to an interrogating signal pulse. The sense point circuit comprises an input for receiving the interrogating signal pulses, an output for providing a first current signal of relatively small magnitude in response to a received interrogating pulse indicating that the solid state device is conductive and a second current signal of a relatively greater magnitude in response to a received interrogating pulse indicating that the solid state device is nonconductive. The sense point circuit additionally comprises a solid state switch having first and second sides, and a control gate, the second side being coupled to the output, a variable impedance means coupled to the switch across the gate and the second side and to the solid state device for enabling the switch to close only when the solid state device is nonconductive, a first resistor coupled between the input and the gate, and a second resistor coupled in series between the input and the first side of the switch, the first resistor having a resistance which is substantially greater than the resistance of the second resistor. As a result, when the solid state device is conductive, the variable impedance means will cause the switch to remain open upon receipt of an interrogating pulse to thereby cause the interrogating pulse to be conducted from the input to the output through the first resistor to thereby provide the first current signal and when the solid state device is nonconductive, the variable impedance means will enable the switch to close upon receipt of an interrogating pulse to thereby cause the interrogating pulse to be conducted from the input to the output through the second resistor and a switch to thereby provide the second current signal.

The present invention also provides a sense point circuit for sensing the active or inactive condition of an electrical path as represented by the conduction or nonconduction of a solid state device in response to an interrogating signal pulse. The sense point circuit comprises an input for receiving the interrogating signal pulse, an output for providing a first signal indicating that the solid state device is conductive during the presence of the interrogating pulse and a second signal indicating that the solid state device is nonconductive in the presence of the interrogating pulse, a transistor having a collector, a base, and an emitter, the collector being coupled to the input and the emitter being coupled to the output, and variable impedance means coupled across the base and emitter and additionally coupled to the solid state device and responsive to the conduction of the solid state device for providing a first impedance across the base and the emitter to thereby cause the output to provide the first signal, and responsive to the nonconduction of solid state device for providing a second impedance across the base and emitter, the second impedance being substantially greater in magnitude than the first impedance to thereby cause the output to provide said second signal.

BRIEF DESCRIPTION OF THE DRAWING

The features of the present invention which are believed to be novel are set forth with particularity in the appended claims. The invention, together with further objects and advantages thereof, may best be understood by reference to the following description taken in conjunction with the accompanying drawing, in which the single FIGURE is a schematic circuit diagram of a sense point circuit embodying the present invention.

DESCRIPTION OF THE PREFERRED EMBODIMENT

Referring now to the sole FIGURE, the sense point circuit thereshown comprises a solid state device 10, a solid state switch or transistor 11, a variable impedance means comprising transformer 12, a first resistor 15, and a second resistor 16.

The solid state device 10 as shown in the sole FIGURE comprises an NPN transistor but could of course be an PNP transistor, a field effect transistor, or any other solid state device which may be rendered conductive or nonconductive in response to the active or inactive condition of an electrical path. Transistor 17 has a base 18 which is preferably coupled to the electrical path such as a solid state supervisory device or the like which renders transistor 17 conductive when the electrical path is active and nonconductive when the electrical path is inactive.

Transformer 12 has a secondary 21 which is coupled across collector 19 of transistor 17 and emitter 20 of transistor 17. Transformer 12 also has a primary 22 which is coupled across the base 23 and emitter 24 of transformer 11. As shown by the dotted nomenclature, the primary winding 22 and secondary winding 21 of transformer 12 are wound in the same direction.

Transistor 11 has a collector 25 which is coupled to the input 26 of the sense point circuit by resistor 16. Input 26 is diode coupled by diode 13 to a driver which provides positive going interrogating pulses which preferably have a magnitude on the order of positive 24 volts and a duration of several microseconds. Resistor 15 is coupled between the common junction of diode 13 and resistor 16 and to the common junction of base 23 and transformer primary 22. Emitter 24 of transistor 11 comprises the output 27 of the sense point circuit and is diode coupled by diode 14 to a receiver (not shown) of a well known type which has an internal ground connection and which also includes a detector for detecting first and second current signals provided at output 27. Diodes 13 and 14 prevent reverse current from flowing through the sense point circuit.

Transistor 11 forms a solid state switch having a first end comprising collector 25, a second end comprising collector 24 and a control gate comprising base 23. When transistor 11 conducts (the solid state switch is closed) a first current path is completed between input 26 and ouput 27 which includes diode 13, second resistor 16, transistor 11, and diode 14. Upon receipt of an interrogating pulse at input 26, if transistor 11 conducts, the interrogating pulse will be conducted from the input 26 to the output 27 through the first current path.

When transistor 11 is nonconductive and an interrogating pulse is received at input 26, the interrogating pulse will be conducted from the input 26 to the output 27 through a second current path including diode 13, first resistor 15, transformer primary 22, and diode 14. The values of the first and second resistors are selected so that the resistance of resistor 15 is substantially greater than the resistance of second resistor 16. For example, resistor 15 may be selected to be 1500 ohms while resistor 16 is selected to be 51 ohms.

In operation, if the electrical path to be sensed is active, transistor 16 will be conductive which effectively short circuits secondary winding 21. This effectively short circuits transformer primary 22 to thus provide a first impedance across base 23 and emitter 24 which is substantially a short circuit. Should an interrogating pulse be received at input 26, because base 23 is effectively shorted to emitter 24, transistor 11 will not conduct and the interrogating pulse will be conducted through diode 13, first resistor 15, and the transformer primary 22 to the output 27 to constitute a first current signal. The magnitude of the first current signal is in the order of 16 miliamperes.

When the electrical network is inactive, transistor 17 will be nonconductive. Upon receipt of an interrogating pulse at input 26, transformer primary 22 will initially appear as an open circuit to therefore enable transistor 11 to conduct. When transistor 11 conducts the interrogating pulse is conducted from input 26 to output 27 through resistor 16 and transistor 11. Thus, when the electrical path is inactive and transistor 17 is non-conductive, transformer 12 will provide at primary 22 a second impedance across base 23 and emitter 24 which is substantially greater in magnitude than the first impedance.

The magnitude of the second current signal is in the order of 470 miliamperes which is substantially greater than the magnitude of the first current signal. The magnitudes of the first and second current signals are therefore easily detected by a suitable receiver coupled to output 27.

The present invention therefore provides a sense point circuit which is suitable for sensing the active or inactive condition of electrical paths which include solid state devices or the like. The variable impedance means comprising transformer 12 effectively isolates the condition being sensed from the interrogating pulses and the sense point circuit.

While a particular embodiment of the invention has been shown and described, modifications may be made, and it is intended in the appended claims to cover all such modifications which fall within the true spirit and scope of the invention.

What is claimed is:

1. A sense point circuit for sensing the active or inactive condition of an electrical path as represented by the conduction or nonconduction of a solid state device, in response to an interrogating signal pulse, said sense point circuit comprising:

an input for receiving the interrogating signal pulses;

an output for providing a first current signal or relatively small magnitude in response to a received interrogating pulse indicating that the solid state device is conductive and a second current signal of relatively greater magnitude in response to a received interrogating pulse indicating that the solid state device is nonconductive;

a solid state switch having first and second sides, and a control gate, said second side being coupled to said output;

a variable impedance means coupled to said switch across said gate and said second side and to said solid state device for enabling said switch to close only when said solid state device is nonconductive;

a first resistor coupled between said input and said gate; and a second resistor coupled in series between said input and said first side of said switch, said first resistor having a resistance which is substantially greater than the resistance of said second resistor; whereby, when said solid state device is conductive, said variable impedance means will cause said switch to remain open upon receipt of an interrogating pulse to thereby cause the interrogating pulse to be conducted from said input to said output through said first resistor and said variable impedance means to thereby provide said first current signal and when said solid state device is nonconductive, said variable impedance means will enable said switch to close upon receipt of an interrogating pulse to thereby cause the interrogating pulse to be conducted from said input to said output through said second resistor and said switch to thereby provide said second current signal.

2. A sense point circuit in accordance with claim 1 wherein said solid state switch comprises a transistor having a base, a collector, and an emitter, wherein said collector comprises said first side coupled to said second resistor, wherein said emitter comprises said second side coupled to said output, wherein said base comprises said gate, and wherein said variable impedance means is coupled to said transistor across said base and said emitter.

3. A sense point circuit in accordance with claim 2 wherein said variable impedance means comprises a transformer having a primary coupled across said base and said emitter and a secondary coupled across said solid state device, whereby when said solid state device is conductive, said primary provides a substantially short circuit between said base and emitter to thereby preclude said transistor from conducting upon receipt of an interrogating pulse at said input, and when said solid state device is nonconductive, said primary will provide a substantially open circuit between said base and emitter to thereby enable said transistor to conduct upon receipt of an interrogating pulse.

4. A sense point circuit for sensing the active or inactive condition of an electrical path as represented by the conduction or nonconduction of a solid state device, in response to an interrogating signal pulse, said sense point circuit comprising:

an input for receiving the interrogating signal pulses;
an output for providing a first signal indicating that the solid state device is conducting during the presence of a received interrogating pulse and a second signal indicating the solid state device is nonconducting in the presence of a received interrogating pulse;
a transistor having a collector, a base, and an emitter, said collector being coupled to said input and said emitter being coupled to said output; and
a variable impedance means coupled across said base and emitter and additionally coupled to the solid state device and responsive to the conduction of said solid state device for providing a first impedance across said base and said emitter to thereby cause said output to provide said first signal, and responsive to the nonconduction of said solid state device for providing a second impedance across said base and emitter, said second impedance being substantially greater in magnitude than said first impedance, to thereby cause said output to provide said second signal.

5. A sense point circuit in accordance with claim 4 wherein said variable impedance means comprises a transformer having a primary and a secondary, wherein said primary is coupled across said base and said emitter and wherein said secondary is coupled across the solid state device.

6. A sense point circuit in accordance with claim 5 further comprising a first resistor and a second resistor, wherein said first resistor is coupled across said input and said base, wherein said second resistor is coupled in series between said input and said collector, and wherein the magnitude of said first resistor is substantially greater than the magnitude of said second resistor, whereby when the solid state device is conducting, said primary will provide said first impedance across said base and emitter causing said transistor to be nonductive in the presence of the interrogating pulse and to thereby cause the interrogating pulse to be conducted from said input to said output through said first resistor to thereby provide said first signal at said output and when the solid state device is nonductive, said primary will provide said second impedance across said base and emitter causing said transistor to be conductive in the presence of the interrogating pulse and to thereby cause the interrogating pulse to be conducted from said input to said output through said second resistor and said transistor to thereby provide said second signal.

7. A sense point circuit for sensing the active or inactive condition of an electrical path as represented by the conduction or non-conduction of a solid state device, in response to an interrogating signal pulse, a sense point circuit comprising:

an input for receiving the interrogating signal pulse;
an output for providing a first signal indicating that the solid state device is conductive during the presence of the interrogating pulse and a second signal indicating that the solid state device is nonconductive in the presence of the interrogating pulse;
a transistor having a collector, a base, and an emitter, said emitter being coupled to said output;
a transformer having a primary and a secondary, said primary being coupled across said base and said emitter to said transistor and said secondary being coupled across the solid state device;
a first resistor coupled across said input and said base of said transistor; and
a second resistor coupled in series between said input and said collector of said transistor, wherein the magnitude of said first resistor is substantially greater than the magnitude of said second resistor; whereby when the solid state device is conductive, said primary will provide a substantially short circuit across said base and emitter causing said transistor to be nonconductive in the presence of the interrogating pulse and to thereby cause the interrogating pulse to be conducted from said input to said output through said first resistor to thereby provide said first signal at said output, and when the solid state device is nonconductive, said primary will provide a substantially open circuit across said base and emitter causing said transistor to be conductive in the presence of the interrogating pulse and to thereby cause the interrogating pulse to be conducted from said input to said output through said second resistor and said transistor to thereby provide said second signal.

* * * * *